(12) United States Patent
Aritome

(10) Patent No.: US 9,236,137 B2
(45) Date of Patent: Jan. 12, 2016

(54) SEMICONDUCTOR DEVICE AND OPERATION METHOD THEREOF

(71) Applicant: Sk hynix Inc., Gyeonggi-do (KR)

(72) Inventor: Seiichi Aritome, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 134 days.

(21) Appl. No.: 14/062,375

(22) Filed: Oct. 24, 2013

(65) Prior Publication Data

US 2015/0003150 A1 Jan. 1, 2015

(30) Foreign Application Priority Data

Jun. 28, 2013 (KR) ........................ 10-2013-0075218

(51) Int. Cl.
- *G11C 11/34* (2006.01)
- *G11C 16/34* (2006.01)
- *G11C 16/04* (2006.01)

(52) U.S. Cl.
CPC ........ *G11C 16/3427* (2013.01); *G11C 16/0483* (2013.01); *G11C 16/3445* (2013.01)

(58) Field of Classification Search
CPC ........... G11C 16/3427; G11C 16/3445; G11C 16/0408
USPC ............................ 365/185.02, 185.22, 185.25
See application file for complete search history.

(56) References Cited

U.S. PATENT DOCUMENTS

| 2009/0219762 A1* | 9/2009 | Mawatari | 365/185.23 |
| 2011/0013458 A1* | 1/2011 | Seol | 365/185.18 |
| 2012/0051135 A1* | 3/2012 | Lee et al. | 365/185.12 |

FOREIGN PATENT DOCUMENTS

KR 1020110131984 12/2011

* cited by examiner

*Primary Examiner* — Richard Elms
*Assistant Examiner* — Mohammed A Bashar
(74) *Attorney, Agent, or Firm* — IP & T Group LLP

(57) ABSTRACT

A semiconductor device and a method of operating the same. The semiconductor device may include a plurality of memory blocks. Each of the plurality of memory blocks may include a plurality of cell strings extending substantially perpendicular to a semiconductor substrate, the plurality of cell strings sharing a plurality of bit lines, and a plurality of source lines respectively connected to the cell strings and word lines. Page buffers, connected to the bit lines, may store data. A selection switch portion may selectively transmit a voltage corresponding to data stored in the page buffers, and voltages supplied from an external source, to the bit lines and the source lines during the program operation, the read operation and the erase operation. A control circuit may control the page buffers and the selection switch portion.

20 Claims, 6 Drawing Sheets

SEMICONDUCTOR DEVICE AND OPERATION METHOD THEREOF

CROSS-REFERENCE TO RELATED APPLICATION

The present application claims priority to Korean patent application number 10-2013-0075218 filed on Jun. 28, 2013, in the Korean Intellectual Property Office, the entire disclosure of which is incorporated by reference herein.

BACKGROUND

1. Technical Field

Various exemplary implementations relate generally to an electronic device and an operating method thereof and, more particularly, to a semiconductor device and a method of operating the same.

2. Related Art

As the need for a mobile phone, a mobile memory device, a digital camera, etc. increases, the need for the nonvolatile memory device used as the memory device for such products is also on the rise. Among the nonvolatile memory device, a NAND flash memory device is mainly used as a data storing device.

The NAND flash memory device may be categorized into a 2-dimensional semiconductor device having a cell string vertically formed on the semiconductor substrate and a 3-dimensional semiconductor device having a cell string vertically formed on the semiconductor substrate.

The 3-dimensional semiconductor device is a memory device devised in order to overcome the limit of degree of integration in 2-dimensional semiconductor devices and includes a plurality of cell strings vertically formed on the semiconductor substrate. The cell strings include a drain selection transistor, memory cells and a source selection transistor connected in series between a bit line and a source line.

Meanwhile, the threshold voltage of the memory cells connected adjacent to the drain selection transistor of the 3-dimensional semiconductor device may vary at the time of the program and read operations due to the resistance adjacent to the source line, which may have a negative impact on the reliability of the 3-dimensional semiconductor device.

BRIEF SUMMARY

Various exemplary implementations relate to a memory device and a method of operating the same.

In an exemplary implementation, a semiconductor device may include a plurality of memory blocks comprising a plurality of cell strings extending substantially perpendicular to a semiconductor substrate, the plurality of cell strings sharing a plurality of bit lines, and a plurality of source lines respectively connected to the cell strings and word lines; page buffers, connected to the bit lines, suitable for storing data; a selection switch portion configured to selectively transmit a voltage corresponding to data stored in the page buffers, and voltages supplied from an external source, to the bit lines and the source lines during the program operation, the read operation and the erase operation; and a control circuit configured to control the page buffers and the selection switch portion.

In an exemplary implementation, a method of operating a semiconductor device including a plurality of cell strings connected between source lines and bit lines and extending substantially perpendicular to a semiconductor substrate, may include performing a first program operation sequentially from memory cells adjacent to the source lines to first memory cells; and In an exemplary implementation, a method of operating a semiconductor device including a plurality of cell strings connected between source lines and bit lines and extending substantially perpendicular to a semiconductor substrate, the method comprising performing a first read operation sequentially from memory cells adjacent to the source lines to first memory cells; and performing a second read operation sequentially from memory cells adjacent to the bit lines to second memory cells that are different than the first memory cells.

In an exemplary implementation, a method of operating a semiconductor device including a plurality of cell strings connected to a plurality of source lines and a plurality of bit lines and extending substantially perpendicular to a semiconductor substrate, the method comprising erasing memory cells included in a selected memory block, connected to the plurality of source lines and the plurality of bit lines, by applying an erase voltage to the plurality of bit lines and the plurality of source lines connected to the selected memory block, and by applying an erase permission voltage to word lines connected to the selected memory block; verifying that the memory cells are erased; and erasing memory cells by applying an erase inhibition voltage to bit lines, of the plurality of bit lines, connected to the cell strings that have been erased, and to source lines, of the plurality of source lines, connected to the cell strings that have been erased

DETAILED DESCRIPTION

Figure 1:
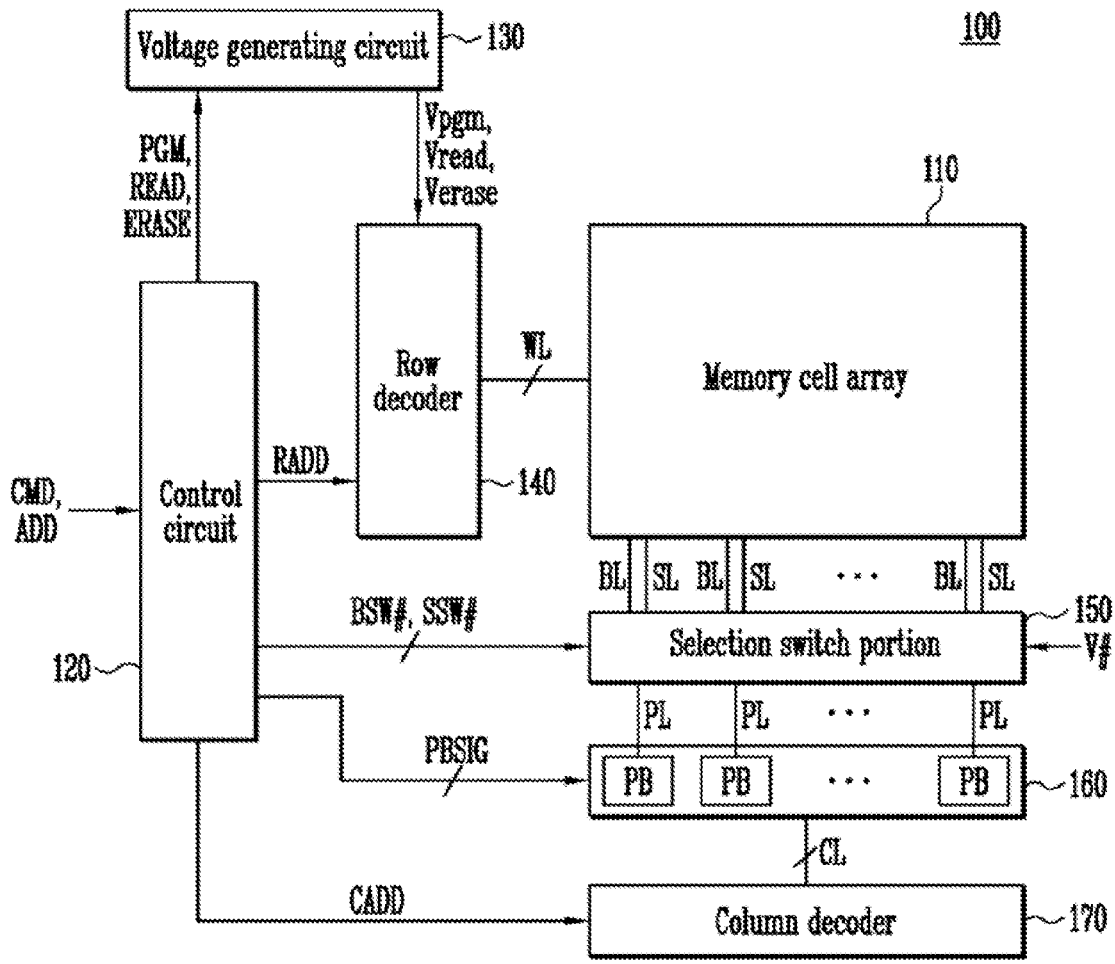
FIG. 1 is a schematic block diagram illustrating a semiconductor device.

Hereinafter, various exemplary implementations will be described in detail with reference to the accompanying drawings. The figures are provided to allow those having ordinary skill in the art to understand the scope of the exemplary implementations of the disclosure. The present invention may, however, be embodied in different forms and should not be construed as limited to the exemplary implementations set forth herein. Rather, these exemplary implementations are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/ coupled" refers to one component not only directly coupling another component but also indirectly coupling another component through an intermediate component. In addition, a singular form may include a plural form as long as it is not specifically mentioned in a sentence.

FIG. 1 is a schematic block diagram illustrating an exemplary semiconductor device.

Referring to FIG. 1, a semiconductor device 100 may include a 3-dimensional memory cell array 110, peripheral circuits 130 to 170 configured to program, read and erase memory cells included in the memory cell array 110 and a control circuit 120 configured to control the peripheral circuits 130 to 170.

The memory cell array 110 may include a plurality of memory blocks, and each of the memory blocks may include a plurality of cell strings having vertical channels, and each of the cell strings may include a plurality of memory cells connected in series along the vertical channels.

The peripheral circuits 130 to 170 may include a voltage generating circuit 130, a row decoder 140, a selection switch portion 150, a page buffer portion 160, and a column decoder 170.

The voltage generating circuit 130 may generate operating voltages needed for each operation, in response to a program signal PGM, a read signal READ, or an erase signal ERASE. Although not shown in the figures, the voltage generating circuit 130 may generate voltages of various levels in addition to a program voltage Vpgm, a read voltage Vread, and an erase voltage Verase.

The row decoder 140 may select a memory block in response to row addresses RADD, and transmit operating voltages generated by the voltage generating circuit 130 to word lines WL and selection lines (not shown) of a selected memory block.

The selection switch portion 150 may be supplied with various voltages V# from external voltage sources and may transmit the voltages V# to bit lines BL or source lines SL in response to bit line selection signals BSW# and source line selection signals SSW#, or may transmit voltages transmitted through page lines PL of the page buffer portion 160 to the bit lines BL or the source lines SL.

The page buffer portion 160 may include a plurality of page buffers PB. The page buffers PB, connected to the bit lines, may be suitable for storing data in response to a page buffer control signal PBSIG. The page buffers PB may transmit a voltage corresponding to the stored data to the page lines PL or sense a voltage applied to the page lines PL.

The column decoder 170 may transmit data to the page buffers PB in response to column addresses CADD or may receive data from the page buffers PB.

The control circuit 120 may output a program signal PGM, a read signal READ, or an erase signal ERASE, in response to a command signal CMD, and addresses ADD, output row addresses RADD and column addresses CADD, and output a page buffer signal PBSIG.

Figure 2:
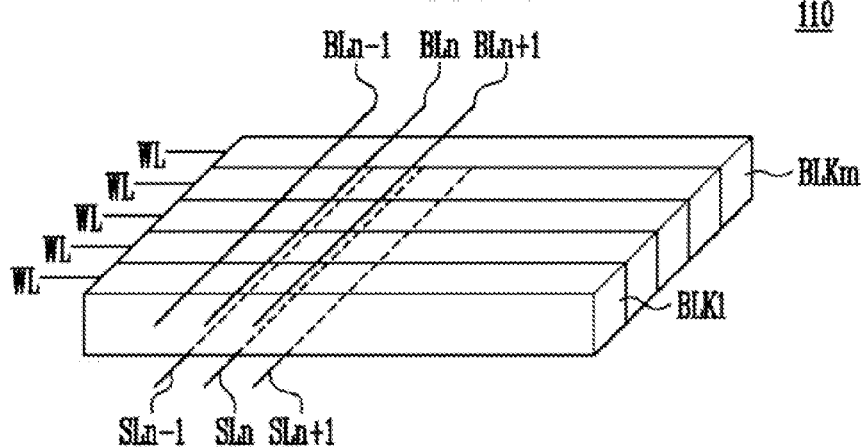
FIG. 2 is a diagram illustrating the configuration of memory blocks according to an exemplary implementation.

FIG. 2 is a diagram illustrating the configuration of memory blocks according to an exemplary implementation.

Referring to FIG. 2, the memory cell array 110 may include a plurality of memory blocks BLK1 to BLKm (where m is a positive integer). The memory blocks BLK1 to BLKm in an exemplary implementation may be composed of a single layer. Each of the memory blocks BLK1 to BLKm may share a plurality of bit lines ...BLn−1, BL, BLn+1... and a plurality of source lines ... SLn−1, SL, SLn+1, ... and be respectively connected to word lines WL. The memory blocks BLK1 to BLKm may include a plurality of cell strings (not shown), and the plurality of cell strings included in a same memory block may be connected to different bit lines . . . BLn−1, BL, BLn+1, . . . and source lines . . . SLn−1, SL, SLn+1, . . . and share word lines WL. Also, the cell strings included in different memory blocks may share the bit lines . . . BLn−1, BL, BLn+1, . . . and the source lines . . . SLn−1, SL, SLn+1, . . . but not the word lines WL.

Figure 3:
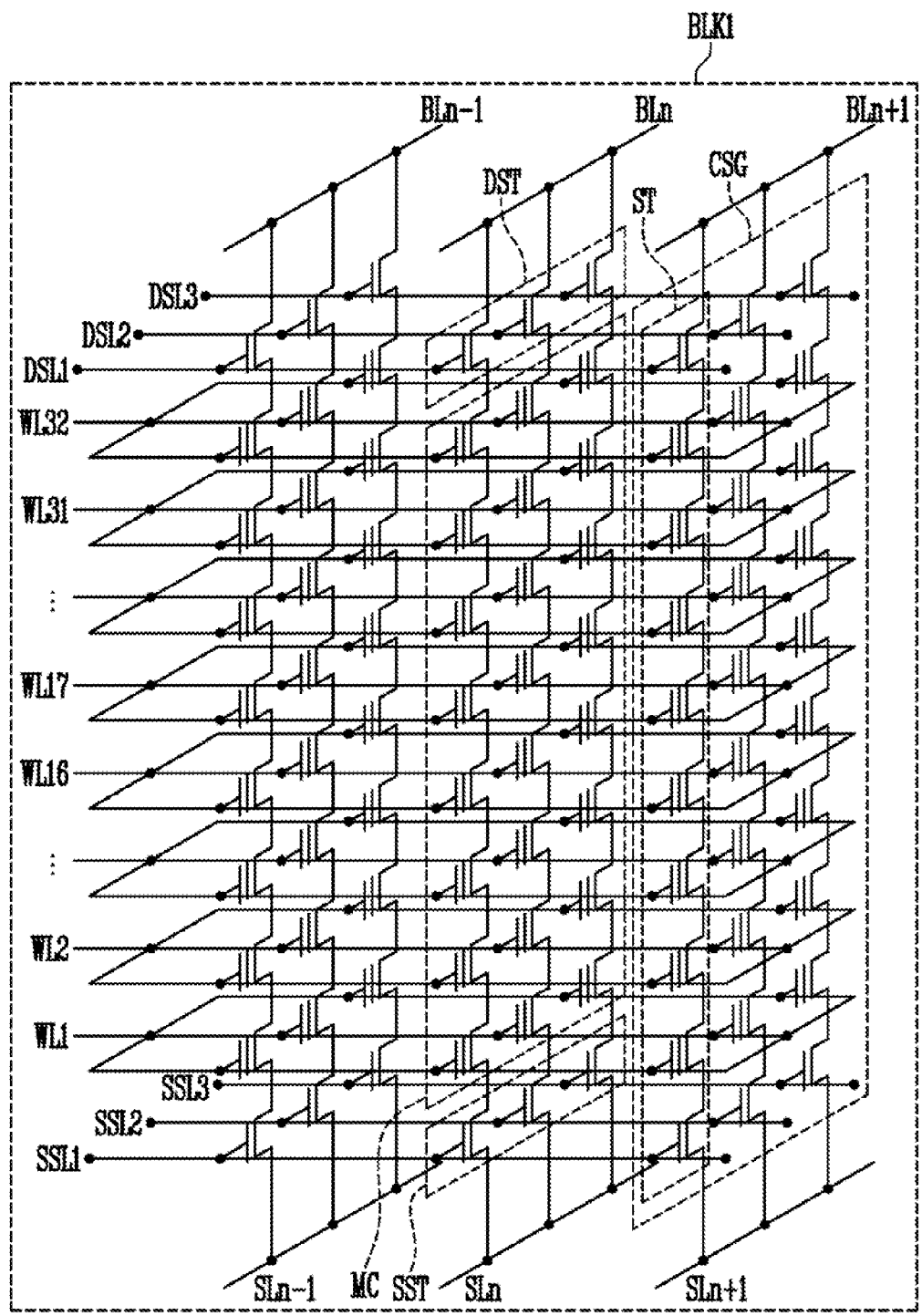
FIG. 3 is a circuit diagram illustrating, in detail, the exemplary memory block shown in FIG. 2.

FIG. 3 is a circuit diagram illustrating, in detail, an exemplary memory block shown in FIG. 2. The memory block BLK1 will be described as an example.

Referring to FIG. 3, the memory block BLK1 may include a plurality of vertical cell string groups CSG on a semiconductor substrate. The cell string groups CSG may be defined as a plurality of cell strings ST connected between the bit lines BLn−1, BLN and BLn+1 and the source lines SLn−1, SLn and SLn+1. Since each of the cell strings ST may be configured in substantially the same manner, only one of the cell strings ST will be described as an example.

The cell string ST may include a drain selection transistor DST connected between the source line SLn and the bit line BLn, a plurality of memory cells MC, and a source selection transistor SST. A gate of the drain selection transistor DST may be connected to a drain selection line DSL1, DLS2 or DSL3, gates of the memory cells MC may be connected to the word lines WL1 to WL32, and a gate of the source selection transistor SST may be connected to the source selection line SSL1. The first to thirty-second word lines WL1 to WL32 are shown in FIG. 3 for illustrative purposes. However, the number of word lines and the number of memory cells may vary depending on a semiconductor device.

The drain selection transistors DST included in the same cell string group CSG may be respectively connected to different drain selection lines DSL1, DSL2 and DSL3. The drain selection transistors DST included in different cell string groups and adjacent to each other may be connected to the same drain selection lines DSL1, DSL2 or DSL3. For example, a first drain selection line DSL1 may be connected to gates of the drain selection transistor DST of a first cell string connected between a nth source line SLn and a nth bit line BLn, the drain selection transistor DST of the first cell string connected between a n−1th source line SLn−1 and a n−1th bit line BLn−1, and the drain selection transistor DST of the first cell string connected between a n+1th source line SLn+1 and a n+1th bit line BLn+1. Also, a second drain selection line DSL2 may be connected to gates of the drain selection transistor DST of a second cell string connected between the nth source line SLn and the nth bit line BLn, the drain selection transistor DST of the second cell string connected between the n−1th source line SLn−1 and the n−1th bit line BLn−1, and the drain selection transistor DST of the second cell string connected between the n+1th source line SLn+1 and the n+1th bit line BLn+1.

Among the memory cells included in the cell string group CSG, the memory cells included in the same page may be connected to the same word line (any one of WL1 to WL32). For example, the first word line WL1 may be commonly connected to the gates of the first memory cells adjacent to the source selection transistor among the memory cells MC included in the cell string group CSG. The second word line WL2 may be commonly connected to the gates of the second memory cells adjacent to the first memory cells among the memory cells MC included in the cell string group CSG. Likewise, a nth word line WLn may be connected to the gates of the nth memory cells.

The gates of the source selection transistors SST, included in the cell string groups CSG, may be connected to the source selection lines SSL1, SSL2 or SSL3. Since the source selection lines SSL1, SSL2 and SSL3 and the source selection transistors SST may be connected in substantially the same manner as the coupling structure of the drain selection lines DSL1, DSL2 and DSL3 and the drain selection transistors DST, a detailed description will be omitted.

Figure 4:
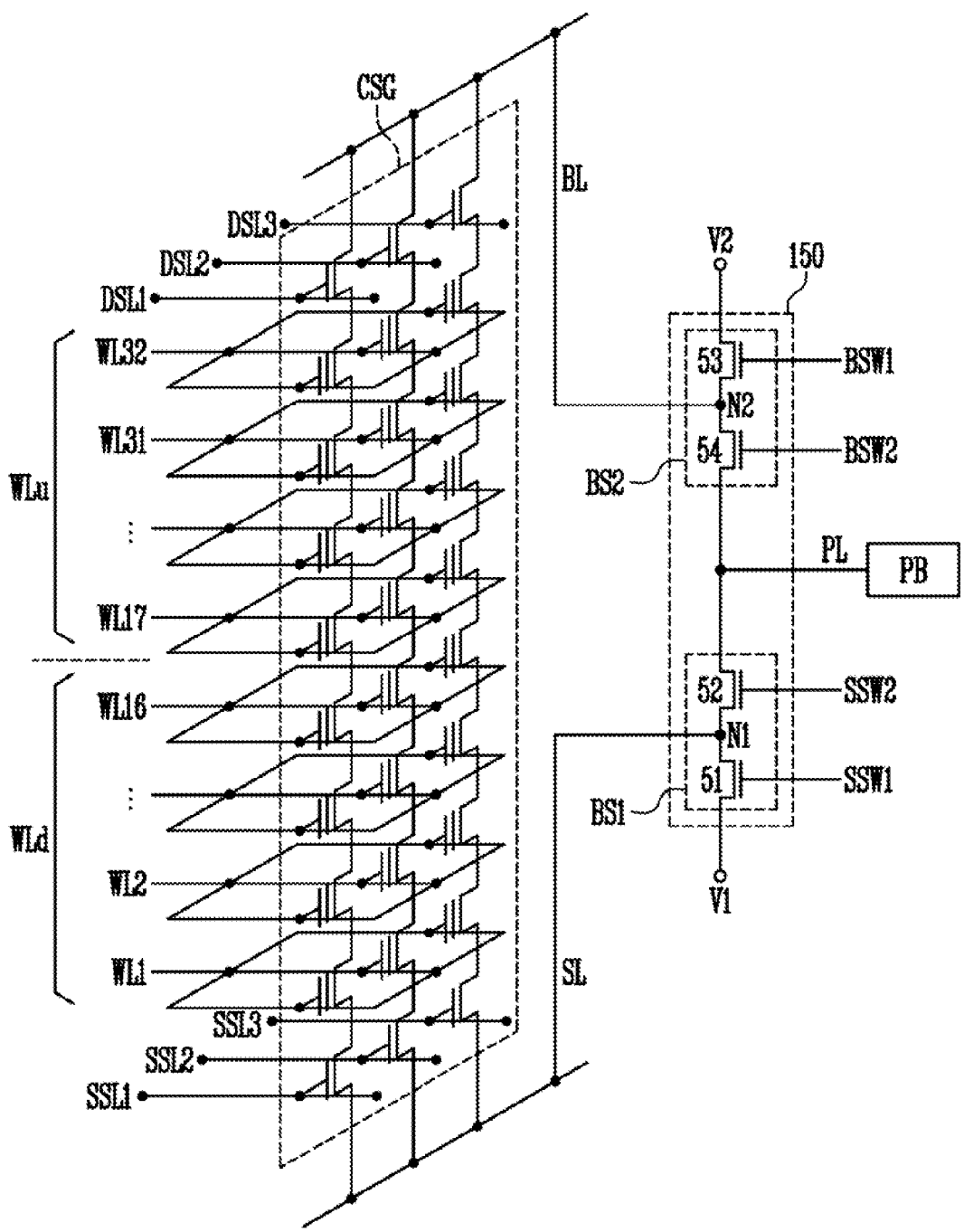
FIG. 4 is a circuit diagram illustrating the coupling relationship between a cell string group and a page buffer and a program operation and a read operation according to an exemplary implementation.

FIG. 4 is a circuit diagram illustrating the coupling relationship between a cell string group and a page buffer and a program operation and a read operation according to an exemplary implementation.

Referring to FIG. 4, each of the page buffers PB is allocated to a cell string group CSG. A page buffer PB may be connected to the cell string group CSG through a selection switch portion 150. In FIG. 4, only one cell string group CSG is shown for convenience purposes, but as shown in FIG. 3, each of the page buffers PB is allocated to the plurality of cell string groups CSG.

The selection switch portion 150 may transmit a voltage output from the page buffer PB to the bit line BL or the source line SL, or may transmit a first or second voltage V1 or V2 supplied from voltage sources other than the page buffers PB to the source line SL or the bit line BL. The selection switch portion 150 will be described below.

The selection switch portion 150 may include a first selection circuit BS1 or a second selection circuit BS2. The first selection circuit BS1 may be connected between a page line PL from where a voltage is output from the page buffer PB and a terminal, to which the first voltage V1 is applied, and the second selection circuit BS2 may be connected between the page line and the terminal, to which the second voltage V2 is applied. The first and second voltages V1 and V2 may be voltages of various levels output from each voltage source. For example, the first and second voltages V1 and V2 may be 0V, a power voltage Vcc or an erase voltage according to the operation of the semiconductor device.

The first selection circuit BS1 may include a first switch 51 connected between a terminal, to which a first voltage V1 is applied, and a first node N1. The first selection circuit BS1 may operating in response to a first source line selection signal SSW1 and a second switch 52 connected between the first node N1 and the page line PL and operating in response to a second source line selection signal SSW2. The source line SL may be connected to the first node N1. The second selection circuit BS2 may include a third switch 53, connected between a terminal, to which the voltage V2 is applied, and a second node N2, and operating in response to a first bit line selection signal BSW1 and a fourth switch 54, connected between the second node N2 and the page line PL, and operating in response to a second bit line selection signal BSW2. The first to fourth switches 51, 52, 53 and 54 may be implemented, for example, as NMOS transistors.

The program operation of the semiconductor device will be described referring to Table 1 below.

Referring to Table 1, the program operation may be performed by categorizing the memory cells included in the cell string into two groups. The first group may include memory cells adjacent to the source lines SL to the memory cells located near the center may be sequentially programmed, and the second group may include memory cells adjacent to the bit line BL to the memory cells located near the center may be sequentially programmed. For example, with respect to 32 memory cells in one cell string, the first to sixteenth memory cells may be defined as the first group WLd, and seventeenth to thirty-second memory cells may be defined as the second group WLu. A program operation of the memory cells included in the first group WLd may be performed in a forward direction, and a program operation the memory cells included in the second group WLu may be performed in a reverse direction. The memory cells included in the first group WLd may be sequentially programmed from the source lines SL towards the center, which is the forward direction, and the memory cells included in the second group WLu may be sequentially programmed from the bit lines BL towards the center, which is the reverse direction. The memory cells connected to the first word line WL1 may be the memory cells adjacent to the source lines SL, and the memory cells connected to the thirty-second word line WL32 may be the memory cells adjacent to the bit lines BL. Accordingly, voltages applied to the source line SL and the bit line BL when a program of the first group WLd and a program of the second group WLu are performed may vary.

To describe a program operation according to an exemplary implementation in detail, among the cell strings included in a memory block BLK1, a program operation of the cell string connected to the first drain selection line DSL1 and the first source selection line SSL1 will be described as an example.

Program Operation of the First Group WLd.

The program operation of the selected memory cells included in the first group WLd may be sequentially performed from the first word line WL1 adjacent to the first source selection line SSL1 towards the center of the cell string.

When the program operation of the first group WLd is carried out, a power voltage Vcc may be applied to the source line SL in order to prevent a leakage of a channel voltage, and a program permission voltage or a program prohibition voltage may be applied to the bit line BL. The first voltage V1 may be the power voltage Vcc, the first switch 51 of the first selection circuit BS1 may be turned on, the second switch 52 may be turned off, and as a result, the power voltage Vcc may be applied to the source line SL. Data "0" or "1" may be input

TABLE 1

|  | 1 | 2 | ... | 15 | 16 | 17 | 18 | ... | 31 | 32 |
|---|---|---|---|---|---|---|---|---|---|---|
| BL | Vcc/0 V | Vcc/0 V | Vcc/0 V | Vcc/0 V | Vcc/0 V | Vcc | Vcc | Vcc | Vcc | Vcc |
| DSL | Vdsl | Vdsl | Vdsl | Vdsl | Vdsl | 0 V | 0 V | 0 V | 0 V | 0 V |
| WL32 | Vpassp | Vpassp | Vpassp | Vpassp | Vpassp | Vpgm | Vpassp | Vpassp | Vpassp | Vpassp |
| WL31 | Vpassp | Vpassp | Vpassp | Vpassp | Vpassp | Vpassp | Vpgm | Vpassp | Vpassp | Vpassp |
| ... | Vpassp | Vpassp | Vpassp | Vpassp | Vpassp | Vpassp | Vpassp | ... | Vpassp | Vpassp |
| WL18 | Vpassp | Vpassp | Vpassp | Vpassp | Vpassp | Vpassp | Vpassp | Vpassp | Vpgm | Vpassp |
| WL17 | Vpassp | Vpassp | Vpassp | Vpassp | Vpassp | Vpassp | Vpassp | Vpassp | Vpassp | Vpgm |
| WL16 | Vpassp | Vpassp | Vpassp | Vpassp | Vpgm | Vpassp | Vpassp | Vpassp | Vpassp | Vpassp |
| WL15 | Vpassp | Vpassp | Vpassp | Vpgm | Vpassp | Vpassp | Vpassp | Vpassp | Vpassp | Vpassp |
| ... | Vpassp | Vpassp | ... | Vpassp | Vpassp | Vpassp | Vpassp | Vpassp | Vpassp | Vpassp |
| WL2 | Vpassp | Vpgm | Vpassp | Vpassp | Vpassp | Vpassp | Vpassp | Vpassp | Vpassp | Vpassp |
| WL1 | Vpgm | Vpassp | Vpassp | Vpassp | Vpassp | Vpassp | Vpassp | Vpassp | Vpassp | Vpassp |
| SSL | 0 V | 0 V | 0 V | 0 V | 0 V | Vssl | Vssl | Vssl | Vssl | Vssl |
| SL | Vcc | Vcc | Vcc | Vcc | Vcc | Vcc/0 V | Vcc/0 V | Vcc/0 V | Vcc/0 V | Vcc/0 V | to the page buffer PB when the program operation is performed. Generally, "0" is the data that is to be programmed, and "1" is the data that is not to be programmed.

When the data "0" is input to the page buffer PB, the program permission voltage, that is, 0V, may be applied along the page line PL. When the data "1" is input to the page buffer PB, the program prohibition voltage, that is, the power voltage Vcc may be applied along the page line PL. That 0V is applied to the page line PL means that the page line PL is connected to a ground terminal through the page buffer PB. Therefore, the program permission voltage 0V or the program prohibition voltage Vcc may be applied according to the data input to the page buffer PB in the page line PL. In the case of a cell string group in which the cell string group CSG performs the program operation, the program permission voltage 0V may be applied to the page line PL, and in the case of an unselected cell string group in which the cell string group is not to program, the program prohibition voltage Vcc may be applied to the page line PL. In order to apply the program permission voltage or the program prohibition voltage to the bit line BL, the third switch 53 of the second selection circuit BS2 may be turned off, and the fourth switch 54 may be turned on.

A program pass voltage Vpassp may be applied to the first to thirty-second word lines WL1 to WL32, a source turn off voltage 0V may be applied to the first to third source selection lines SSL1, SSL2 and SSL3, and a drain turn on voltage Vdsl may be applied to the first to third drain selection lines DSL1 to DSL3. In order to form a channel at the cell strings and generate a channel boosting to unselected cell strings, a drain turn on voltage Vdsl having a high level may be applied to the first to third drain selection lines DSL1 to DSL3, and thereafter, the level of the drain turn on voltage Vdsl may be reduced down to a voltage that is higher than 0V. For example, the drain turn on voltage Vdsl that is about 4V may be applied to the first to third drain selection lines DSL1 to DSL3, and the voltage applied to the bit line BL may be transmitted to the cell strings. When the drain turn on voltage Vdsl is reduced to about 1.5V, the drain selection transistors of the cell strings where the program prohibition voltage is transmitted to the channel may be turned off, and as a result, the channel boosting may occur at the unselected cell strings by the program permission voltage Vpassp and the program prohibition voltage.

The selected memory cells may be programmed by applying a program voltage Vpgm to the selected first word line WL1.

As described above, by applying the program voltage sequentially from the second word line WL2 to the sixteenth word line, the selected memory cells included in the first group WLd may be programmed.

Program Operation of the Second Group WLu.

When the program operation of the selected memory cells included in the first group WLd is completed, the program operation of the selected memory cells included in the second group WLu may be performed.

The program operation of the selected memory cells included in the second group WLu may be sequentially performed from the thirty-second word line WL32 adjacent to the first drain selection line DSL1 towards the center of the cell string.

In the program operation of the second group WLu, in contrast to the program operation of the first group WLd, the program permission voltage or the program prohibition voltage may be applied to the source line SL after applying the power voltage Vcc in order to prevent the leakage of the channel voltage to the source line SL. In order to achieve this purpose, the second voltage V2 may be the power voltage Vcc, the third switch 53 of the second selection circuit BS2 may be turned on, the fourth switch 54 may be turned off, and the power voltage Vcc may be applied to the bit line BL. During the program operation, the data "0" or "1" is input, and generally, "0" is the data to be programmed, and "1" is the data not to be programmed.

When the data "0" is input to the page buffer PB, the program permission voltage, that is, 0V is applied to the page line PL. When the data "1" is input to the page buffer PB, the program prohibition voltage, that is, the power voltage Vcc may be applied along the page line PL. That 0V is applied to the page line PL means that the page line PL is connected to the ground terminal through the page buffer PB. Accordingly, the program permission voltage 0V or the program prohibition voltage Vcc may be applied to the page line PL according to the data input to the page buffer PB. In the case that the cell string group CSG is a selected cell string group that is to perform the program operation, the program permission voltage 0V is applied to the page line PL, and in the case that the cell string group CSG is the unselected cell string group that is not to program, the program prohibition voltage Vcc is applied to the page line PL.

In order for the second voltage V2 having the power voltage Vcc level to be applied to the source line SL, the third switch 53 of the second selection circuit BS2 may be turned on and the fourth switch 54 may be turned off. In order to apply the program permission voltage or the program prohibition voltage to the source line SL, the first switch 51 of the first selection circuit BS1 may be turned off and the second switch 52 may be turned on.

The program pass voltage Vpassp may be applied to the first to thirty-second word lines WL1 to WL32, the turn off voltage 0V may be applied to the first to third drain selection lines DSL1 to DSL3, the source turn on voltage Vssl may be applied to the first to third source selection lines SSL1 to SSL3. In order to form the channel at the cell strings and generate the channel boosting at the unselected cell string, the source turn on voltage Vssl, having a high level may be applied to the first to third source selection lines SSL1 to SSL3, and thereafter, a level of the source turn on voltage Vssl may be reduced but substantially be maintained to be higher than 0V. The source turn on voltage Vssl, which may be about 4V, may be applied to the first to third source selection lines SSL1 to SSL3, and the voltage applied to the source line SL may be transmitted to the cell strings. When the source turn on voltage Vssl is reduced to about 1.5V, the source selection transistors SST of the cell strings where the program prohibition voltage is transmitted to the channel are turned off, and as a result, the channel boosting may occur due to the program pass voltage Vpassp and the program prohibition voltage at the unselected cell strings.

The program voltage Vpgm may be applied to the selected thirty-second word line WL32 to program the selected memory cells.

The selected memory cells included in the second group WLu may be programmed as the program voltage is applied sequentially to the thirty-first word line WL31 to the 17th word lines using the method described above.

During the program operation of the second group WLu distanced apart from the source line SL, the program operation may be sequentially performed in order of proximity to the bit line BL. Here, by using the bit line BL as the source line SL and using the bit line BL as the source line SL, the resistance in the cell string may be reduced due to the distance with the source line SL when the program operation is carried out. When the program operation is performed, by having the resistance in the cell string be reduced, a program disturbance may be restricted and retention characteristics may be enhanced, thereby improving the reliability of the program operation.

The read operation of the semiconductor device will be described referring to Table 2 below.

TABLE 2

| | 1 | 2 | ... | 15 | 16 | 17 | 18 | ... | 31 | 32 |
|---|---|---|---|---|---|---|---|---|---|---|
| BL | VCC | VCC | VCC | VCC | VCC | 0 V | 0 V | 0 V | 0 V | 0 V |
| DSL | Vdsl | Vdsl | Vdsl | Vdsl | Vdsl | Vdsl | Vdsl | Vdsl | Vdsl | Vdsl |
| WL32 | Vpassr | Vpassr | Vpassr | Vpassr | Vpassr | Vread | Vpassr | Vpassr | Vpassr | Vpassr |
| WL31 | Vpassr | Vpassr | Vpassr | Vpassr | Vpassr | Vpassr | Vread | Vpassr | Vpassr | Vpassr |
| ... | Vpassr | Vpassr | Vpassr | Vpassr | Vpassr | Vpassr | Vpassr | ... | Vpassr | Vpassr |
| WL18 | Vpassr | Vpassr | Vpassr | Vpassr | Vpassr | Vpassr | Vpassr | Vpassr | Vread | Vpassr |
| WL17 | Vpassr | Vpassr | Vpassr | Vpassr | Vpassr | Vpassr | Vpassr | Vpassr | Vpassr | Vread |
| WL16 | Vpassr | Vpassr | Vpassr | Vpassr | Vread | Vpassr | Vpassr | Vpassr | Vpassr | Vpassr |
| WL15 | Vpassr | Vpassr | Vpassr | Vread | Vpassr | Vpassr | Vpassr | Vpassr | Vpassr | Vpassr |
| ... | Vpassr | Vpassr | ... | Vpassr | Vpassr | Vpassr | Vpassr | Vpassr | Vpassr | Vpassr |
| WL2 | Vpassr | Vread | Vpassr | Vpassr | Vpassr | Vpassr | Vpassr | Vpassr | Vpassr | Vpassr |
| WL1 | Vread | Vpassr | Vpassr | Vpassr | Vpassr | Vpassr | Vpassr | Vpassr | Vpassr | Vpassr |
| SSL | Vssl | Vssl | Vssl | Vssl | Vssl | Vssl | Vssl | Vssl | Vssl | Vssl |
| SL | 0 V | 0 V | 0 V | 0 V | 0 V | VCC | VCC | VCC | VCC | VCC |

Referring to Table 2, the read operation may be carried out in a substantially similar manner as the program operation described above. The read operation may be performed by categorizing the memory cells included in the cell string into two groups. The case in which 32 memory cells are included in one string will be described as an example. The first to sixteenth memory cells may be defined as the first group WLd, and the seventeenth to thirty-second memory cells may be defined as the second group WLu. The read operation of the memory cells included in the first group WLd may be performed in a forward direction, and the read operation of the memory cells included in the second group WLu may be performed in a reverse direction. The memory cells included in the first group WLd may read the memory cells in the order arranged from the source line SL towards the center, and the memory cells included in the second group WLu may read the memory cells in the order arranged from the bit line BL towards the center. Accordingly, voltages applied to the source line SL and the bit line BL when the read operation of the first group WLd and the read operation of the second group WLu are performed may vary.

To describe the read operation according to an exemplary implementation in detail, among the cell strings included in a memory block BLK11, the read operation of the cell string connected to the first drain selection line DSL1 and the first source selection line SSL1 will be described as an example.

Read Operation of the First Group WLd.

The read operation of the selected memory cells included in the first group WLd may be sequentially carried out from the first word line WL1 adjacent to the first source selection line SSL1 towards the center of the cell string.

When the read operation of the first group WLd is performed, 0V may be applied to the source line SL, and a precharge voltage may be applied to the bit line BL. For example, the precharge voltage may be a positive voltage such as the power voltage Vcc. The first voltage V1 may be 0V, the first switch 51 of the first selection circuit BS1 may be turned on, and the second switch 52 may be turned off such that the first voltage V1 of 0V may be applied to the source line SL. When the read operation is carried out, the data "0" may be input to the page buffer. When the data "0" is input to the page buffer PB, the precharge voltage may be applied along the page line PL. In order to apply the precharge voltage to the bit line BL, the third switch 53 of the second selection signal BS2 may be turned off, and the fourth switch 54 may be turned on.

The read voltage Vread may be applied to the first word line WL1, and the read pass voltage Vpassr may be applied to the second to thirty-second word lines WL2 to WL32, the source turn on voltage Vssl may be applied to the first to third source selection lines SSL1, SSL2 and SSL3, and the drain turn on voltage Vdsl may be applied to the first to third drain selection lines DSL1 to DSL3 such that the selected memory cells connected to the first word line WL1 may be read. The source turn on voltage Vssl and the drain turn on voltage Vdsl may be voltages having a 4V voltage level.

As described above, as the read voltage may be applied sequentially from the second word line WL2 to the sixteenth word line, the selected memory cells included in the first group WLd may be sequentially read.

Read Operation of the Second Group WLu.

When the read operation of the selected memory cells included in the first group WLd is completed, the read operation of the selected memory cells included in the second group WLu may be performed.

The read operation of the selected memory cells included in the second group WLu may be sequentially performed from the thirty-second word line WL32 adjacent to the first drain selection line DSL1 towards the center of the cell sting.

In the read operation of the second group WLu, in contrast to the read operation of the first group WLd, 0V may be applied to the bit line BL, and the precharge voltage may be applied to the source line SL. In order to achieve this purpose, the second voltage V2 may be 0V, and the third switch 53 of the second selection circuit BS2 may be turned on, the fourth switch 54 may be turned off, thereby applying the second voltage V2 of 0V may be applied to the bit line BL. The data "0" may be input to the page buffer PB at the time of the read operation. When the data "0" is input to the page buffer PB, the precharge voltage may be applied along the page line PL. In order to apply the precharge voltage to the source line SL, the first switch 51 of the first selection circuit BS1 may be turned off, and the second switch 52 may be turned on.

The read voltage Vread may be applied to the thirty-second word line WL32, the read pass voltage Vpassr may be applied to the thirty-first to first word lines WL31 to WL1, the drain turn on voltage Vdsl may be applied to the first to third drain selection lines DSL1 to DSL3, and the source turn on voltage Vssl may be applied to the first to third source selection lines SSL1, SSL2 and SSL3, thereby reading the selected memory cells connected to the thirty-second word line WL1. The drain turn on voltage Vdsl and the source turn on voltage Vssl may be a voltage having a 4V voltage level.

Using the method described above, as the read voltage is applied sequentially to the thirty first word line WL31 to the seventeenth word line, the selected memory cells included in the second group WLu may be read. The read operation may be performed by sensing a voltage change of the precharged bit lines BL or the precharged source lines SL. Since the sensing method is a disclosed technology that is well-known, the description regarding the sensing method will be omitted.

As described above, the read operation may be sequentially performed in order of proximity to the bit line BL when the read operation of the second group WLu distanced apart from the source line SL is performed. As the bit line BL is used as the source line SL, and the source line SL is used as the bit line BL, the resistance in the string due to the distance with the source line SL when the read operation is carried out may be reduced. As a result, the reliability of the read operation may be enhanced.

The erase operation of the semiconductor device will be described referring to the following figures.

Figure 5:
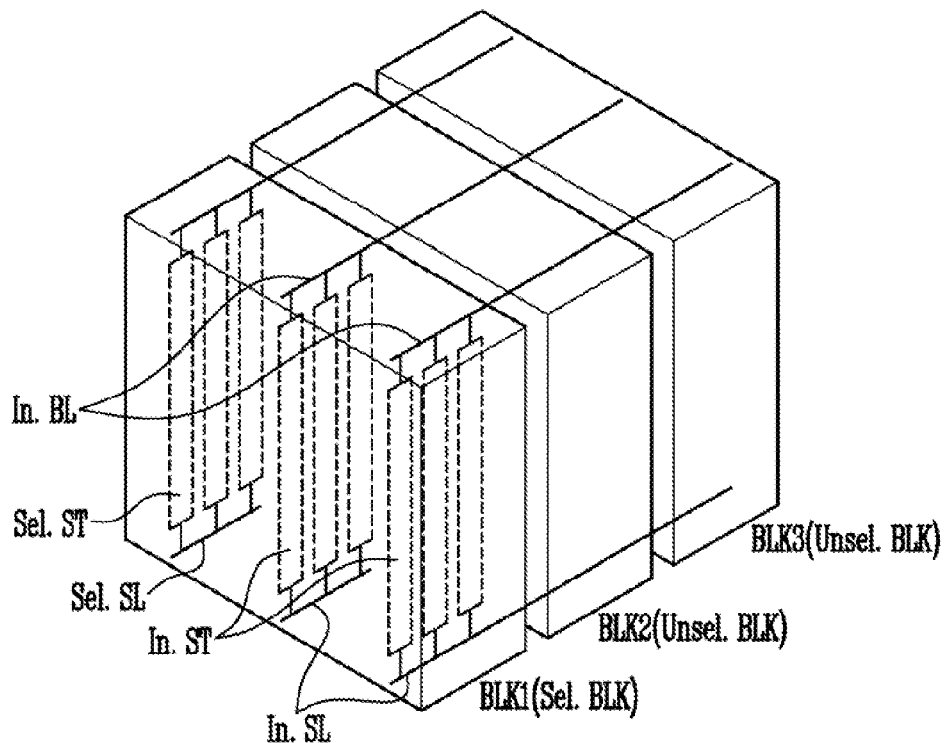
FIG. 5 and FIG. 6 are diagrams illustrating an erase operation of memory blocks according to an exemplary implementation.
Figure 6:
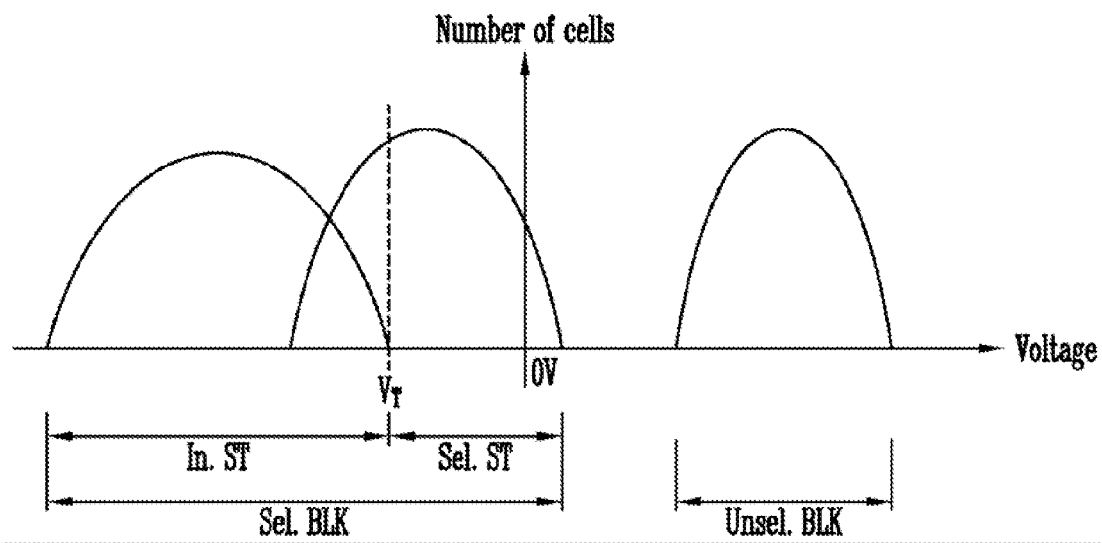

FIG. 5 and FIG. 6 are diagrams illustrating an erase operation of memory blocks according to an exemplary implementation. FIG. 5 is a diagram illustrating the operating method of the selected memory block and the unselected memory blocks when the erase operation is performed, and FIG. 6 is a diagram illustrating the threshold voltage of the memory cells when the erase operation is carried out.

Referring to FIGS. 5 and 6, the erase operation according to an exemplary implementation will be described below.

The memory cell array 110 may include a plurality of memory blocks BLK1, BLK2, BLK3, . . . . For convenience, three memory blocks will be described as an example. The erase operation may erase only the memory cells included in the selected memory block among the plurality of memory blocks BLK1, BLK2, BLK3, . . . and may not erase the memory cells included in the remaining unselected memory blocks. However, since the plurality of memory blocks share the source lines with the bit lines, different voltages may be respectively applied to the word lines connected to the selected memory block and the unselected memory block.

For convenience, in an exemplary implementation, the memory block BLK1 will be described as the selected memory block Sel. BLK that is to be erased, and the remaining blocks BLK2 and BLK3 will be described as the unselected memory blocks Unsel. BLK.

The erase operation may be performed using a method of incremental step pulse erase (ISPE) that repeats, while progressively increasing the erase voltage, an operation of applying the erase voltage and an erase verification operation. When the erase operation commences, in order to erase the memory cells included in the selected memory block Sel. BLK, the erase voltage may be applied to all of the bit lines BL and the source lines SL, the turn on voltage (for example, 15V) may be applied to all of the drain selection lines DSL1 to DSL3 in FIG. 3 and the source lines SSL1 to SSL3 in FIG. 3, the erase permission voltage (for example, 0V) may be applied to the word lines WL1 to WL32 of the selected memory block Sel. BLK, and the erase prohibition voltage (for example, 18V) may be applied to the unselected memory blocks Unsel. BLK. In an exemplary implementation, a voltage that is substantially the same as the erase voltage that is applied to the bit lines BL and the source lines SL may be used as the erase prohibition voltage, for example, 18V may be used as the erase voltage and the erase prohibition voltage.

The erase operation will be described referring to Table 3 below.

TABLE 3

|  | Sel. BLK | | Unsel. BLK |
| --- | --- | --- | --- |
|  | Sel. ST | In. ST | Unsel. ST |
| BL | Verase | Vinh | Verase/Vinh |
| DSL | Vdsl | Vdsl | Vdsl |
| WL32 | 0 V | 0 V | Vwl |
| . . . | 0 V | 0 V | Vwl |
| WL1 | 0 V | 0 V | Vwl |
| SSL | Vssl | Vssl | Vssl |
| SL | Verase | Vinh | Verase/Vinh |

Referring to Table 3, when the erase operation commences, the erase voltage Verase may be applied to the bit lines BL and the source lines SL connected to all of the memory blocks Sel. BLK and Unsel. BLK, and the drain turn on voltage Vdsl and the source turn on voltage Vssl may be applied to the drain selection lines DSL and the source selection lines SSL. The erase permission voltage may be applied to all of the word lines WL1 to WL32 connected to the selected memory block Sel. BLK, and only the unselected cell strings Unsel. ST may be included in the remaining unselected memory blocks Unsel. BLK except for the selected memory blocks Sel. BLK. Therefore, the erase prohibition voltage Vwl may be applied to all of the word lines WL1 to WL32 connected to the unselected cell strings Unsel. ST. For example, the erase voltage Verase may be set to 18V, the drain and source turn on voltages Vdsl and Vssl may be set to 15V, the erase permission voltage may be set to 0V, the erase prohibition voltage Vwl may be set to the same voltage as the erase voltage Verase or a voltage that is lower than the drain and source turn on voltages Vdsl and Vssl but higher than 0V. The erase voltage Verase and the drain and source turn on voltages Vdsl and Vssl may vary depending on the semiconductor device, but when the erase prohibition voltage Vwl is set to a voltage that is lower than the drain and source turn on voltages Vdsl and Vssl but higher than 0V, the erase prohibition voltage Vwl may be set to about 13.5V. In order to apply the erase voltage Verase to the bit lines BL and the source lines SL, the first and second voltages (refer to FIG. 4) having the erase voltage Verase may be applied to the bit lines BL and the source lines SL.

Since the erase operation is performed using the ISPE method, the erase verification operation may be performed after the erase voltage is applied through the bit lines BL and the source lines SL. The erase verification operation may be performed in cell string units, the cell strings commonly connected to the bit line BL. That is, the erase verification operation may be performed in the cell string group CSG units described in FIG. 3.

The cell strings that passed the erase verification operation may be erase inhibition cell strings In. ST, and the bit lines BL and the source lines SL connected to the erase inhibition cell strings In. ST may be respectively defined as the erase inhibition bit lines In. BL and the erase inhibition source lines In. SL. The cell strings ST that did not pass the erase verification operation may be defined as the selected cell strings Sel. ST, and the bit lines BL and the source lines SL connected to the selected cell strings Sel. ST may be respectively defined as the selected bit lines Sel. BL and the selected source lines Sel. SL. Referring to FIG. 6, the threshold voltage in the memory cells included in the selected memory blocks Sel. BLK may be reduced since the erase operation is performed. When the threshold voltage of the memory cells is reduced to the erase target voltage $V_T$, the corresponding memory cell is completely erased. However, since the cell string includes a plurality of memory cells, the threshold voltage of all of the memory cells included in the cell string needs to be reduced to the erase target voltage $V_T$ in order for the erase verification operation for the corresponding cell string is passed. As a result, the cell string may be the erase inhibition cell string In. ST. While the erase operation is performed on the selected memory blocks Sel. BLK, the threshold voltage of the program memory cells included in the unselected memory blocks Unsel. BLK may be substantially maintained.

While the erase operation is carried out, the memory cells included in the selected cell strings Sel. ST may be erased by applying the erase voltage to selected bit lines Sel. BL and selected source lines Sel. SL, and a decrease in the threshold voltage of the memory cells included in the erase inhibition cell strings is inhibited by applying the erase inhibition voltage Vinh to erase inhibition bit lines In. BL and erase inhibition source lines In. SL. In order to achieve this purpose, the erase inhibition voltage Vinh may be set to a voltage lower than the erase voltage Verase, which may be set to a voltage that is ½ of the erase voltage Verase. For example, if the erase voltage Verase is 18V, the erase inhibition voltage Vinh may be set to 9V. Here, since the erase permission voltage 0V is applied to all of the word lines WL1 to WL32 connected to the selected memory block Sel. BLK, there may be about 9V voltage difference between the word lines WL and the channel at the erase inhibition cell strings In. ST. With the voltage difference of 9V, it is difficult to further reduce the threshold voltage of the memory cells in which the erase is completed, and therefore excessive erasure of the memory cells, in which the erase is completed, may be inhibited.

Since the erase prohibition voltage Vwl may be applied to all of the word lines WL1 to WL32 connected to the unselected memory blocks Unsel. BLK, even if the erase voltage (for example, 18V) is applied to the selected bit lines Sel. BL, there does not occur a great voltage difference between the word lines WL and the channel. For example, when the erase prohibition voltage Vwl is the same as the erase voltage Verase, the voltage difference between the word lines WL and the channel would be 0V. Therefore, the memory cells would not be erased. In addition, as described above, when the erase prohibition voltage Vwl is set to about 13.5V, the voltage difference between the word lines WL and the channel would be about 4.5V. With 4.5V voltage difference, the memory cells would not be erased.

Since the erase inhibition voltage (for example, 9V) is applied to the erase inhibition bit lines In. BL and the erase inhibition source lines In. SL connected to the unselected memory blocks Unsel. BLK, even if the erase prohibition voltage Vwl that is the same as the erase voltage Verase is applied to the word lines WL1 to WL32, the voltage difference of about 9V between the word lines and the channel may occur. With 9V voltage difference, the memory cells would not be erased. Therefore, the erasure of the memory cells included in the unselected memory blocks Unsel. BLK may be prohibited. Even if the erase prohibition voltage Vwl is set to 13.5V, the voltage difference between the word lines and the channel would be about 4.5V, and therefore, the erasure of the memory cells may be prohibited.

When all of the memory cells included in the selected memory block Sel. BLK by repeating the erase operation as described above pass the erase verification operation, the erase operation is completed.

As described above, by inhibiting excessive erasure of the cell strings, in which the erase is completed, increase in the threshold voltage distribution width of the memory cells, in which the erase is completed, may be inhibited, and stress due to the erase voltage of the unselected memory cells that are not the erase targets may be inhibited.

Figure 7:
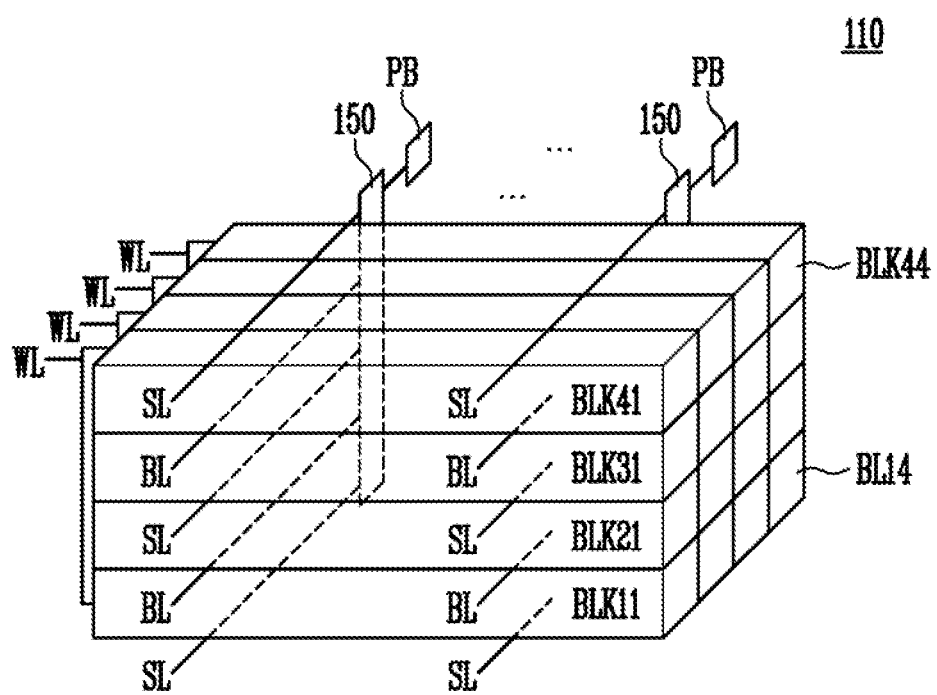
FIG. 7 is a diagram illustrating a configuration of memory blocks according to an exemplary implementation.

FIG. 7 is a diagram illustrating the configuration of memory blocks according to an exemplary implementation.

Referring to FIG. 7, the memory cell array 110 may include a plurality of memory blocks BLK11 to BLK 44. In an exemplary implementation, the memory blocks BLK11 to BLK44 may be multi-layered with substantially the same configuration as each other. In addition, for convenience, in FIG. 7, four memory blocks are arranged longitudinally, and four memory blocks are arranged vertically. The number of memory blocks may vary depending on the semiconductor device.

Among the memory blocks BLK11 to BLK44, the memory blocks that are vertically stacked may share different word lines WL, but different word lines WL may be connected to the memory blocks arranged longitudinally. For example, the memory blocks BLK11 to BLK41 arranged vertically may share the same word lines WL, the memory blocks BLK11 to BLK14 longitudinally arranged may be connected to different word lines WL. Accordingly, the memory cells vertically arranged may apply the same voltage simultaneously through the word lines commonly connected, and different voltages may be simultaneously applied to the word lines of the longitudinally arranged memory blocks. Also, the longitudinally arranged memory blocks may share the bit lines BL and the source lines SL. The bit lines BL and the source lines SL vertically arranged may be commonly connected to the selection switch portion 150, and the bit lines and the source lines SL longitudinally arranged may be connected to different selection switch portion 150. The page buffer PB may be respectively connected to each of the selection switch portion 150.

Figure 8:
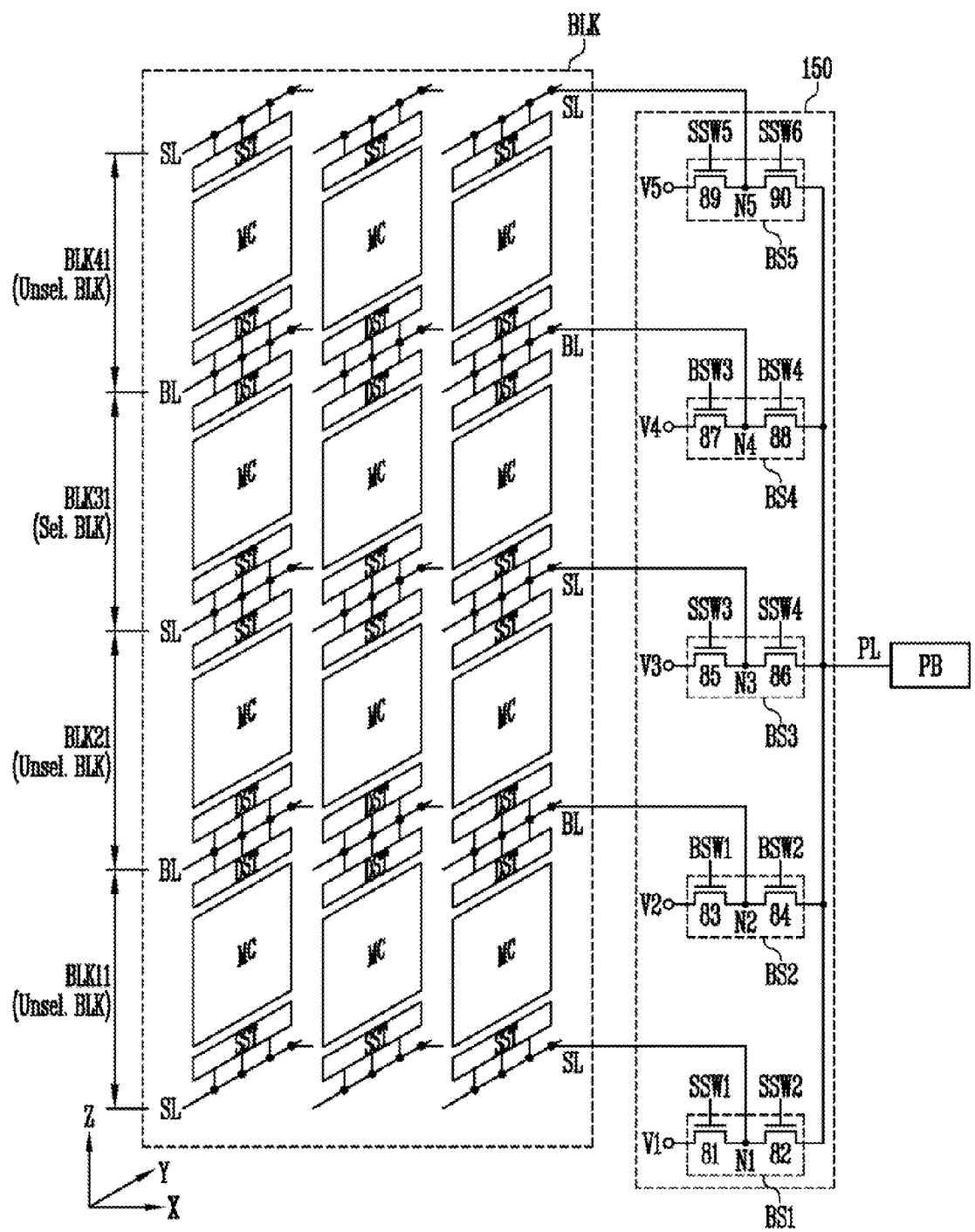
FIG. 8 illustrates, in detail, the memory blocks shown in FIG. 7 and a program operation, a read operation and an erase operation.

FIG. 8 illustrates in detail the memory blocks shown in FIG. 7 and a program operation, a read operation and an erase operation according to an exemplary implementation.

Referring to FIG. 8, the memory blocks BLK11, BLK21, BLK31 and BLK41 vertically stacked will be described as an example.

For convenience, BLK11 will be described as the first memory block, BLK21 will be described as the second memory block, BLK31 will be described as the third memory block and BLK41 will be described as the fourth memory block. The source selection line SSL, the word line WL and the drain selection line DSL, respectively connected to the first to fourth memory blocks BLK11 to BLK41, may be arranged to be symmetrical with respect to the source line SL or the bit line BL, which are shared by the memory blocks adjacent to each other. Each of the memory blocks will be described below.

The source lines SL may be arranged under the first memory block BLK11, and the source selection transistors SST may be arranged over the source lines SL. The memory cells MC may be arranged over the source selection transistors SST, and the drain selection transistors DST may be arranged over the memory cells MC. The bit lines BL may be arranged over the drain selection transistors DST. The source lines SL, the source selection lines SSL, the word lines WL, the drain selection lines DSL and the bit lines BL may be sequentially arranged from a lower part of the first memory block BLK11 to an upper part of the first memory block BLK11.

The second memory block BLK21 may be stacked over the first memory block BLK11 and may share the bit lines BL of the first memory block BLK11. Accordingly, the bit lines BL may be arranged under the second memory block BLK21, and the drain selection lines DSL, the word lines WL, the source selection lines SSL and the source lines SL may be sequentially arranged over the bit lines BL.

The third memory block BLK31 may be stacked over the second memory block BLK21 and may share the source lines SL of the second memory block BLK21. Accordingly, the source lines SL may be arranged under the third memory block BLK31, and the source selection lines SSL, the word lines WL, the drain selection lines DSL and the bit lines BL may be sequentially arranged over the source lines SL.

The fourth memory block BLK41 may be stacked over the third memory block BLK31 and may share the bit lines BL of the third memory block BLK31. Accordingly, the bit lines BL may be arranged under the fourth memory block BLK41, and the drain selection lines DSL, the word lines WL, the source selection lines SSL and the source lines SL may be sequentially arranged over the bit lines BL.

Also, the memory cells MC included in the first to fourth memory blocks BLK11 to BLK41 may be categorized into first and second groups, and the first and second groups of the memory blocks adjacent to each other may be arranged symmetrically with respect to each other. For example, if the first group is arranged under the first memory block BLK11 and the second group is arranged over the first memory block BLK11, the second group will be arranged under the second memory block BLK21 and the first group will be arranged over the second memory block BLK21.

The selection switch portion 150 may include first to fifth selection circuits BS1 to BS5. The first to fifth selection circuits BS1 to BS5 may be configured substantially the same as each other. The first to fifth selection circuits BS1 to BS5 may respectively receive first to fifth voltages V1 to V5, and may be connected to the page buffer PB through the page line PL, which is commonly connected.

The first selection circuit BS1 may be configured to selectively transmit the first voltage V1 or the voltage transmitted from the page buffer PB to the source line SL of the first memory block BLK11. The first selection circuit BS1 may include first and second switches 81 and 82, connected in series between the terminal, to which the first voltage V1 is applied, and the page line PL. The first switch 81 may be implemented as a NMOS transistor operating in response to the first source line selection signal SSW1, and the second switch 82 may be implemented as an NMOS transistor operating in response to the second source line selection signal SSW2. The source line SL of the first memory block BLK11 may be connected between the first and second switches 81 and 82.

The second selection circuit BS2 may be configured to selectively transmit the second voltage V2 or the voltage transmitted from the page buffer PB to the bit line BL that the first and second memory blocks BLK11 and BLK21 share. The second selection circuit BS2 may include third and fourth switches 83 and 84, connected in series between a terminal, to which the second voltage V2 is applied, and the page line PL. The third switch 83 may be implemented as an NMOS transistor operating in response to the first bit line selection signal BSW1, and the fourth switch 84 may be implemented as an NMOS transistor operating in response to the second bit line selection signal BSW2. The bit line BL that the first and second memory blocks BLK11 and BLK21 share may be connected between the third and fourth switches 83 and 84.

The third selection signal BS3 may be configured to selectively transmit the third voltage V3 or a voltage transmitted from the page buffer PB to the source line SL that the second and third memory blocks BLK21 and BLK31 share. The third selection circuit BS3 may include fifth and sixth switches 85 and 86 connected in series between a terminal, to which the third voltage V3 is applied, and the page line PL. The fifth switch 85 may be implemented as an NMOS transistor operating in response to the third source line selection signal SSW3, and the sixth switch 86 may be implemented as an NMOS transistor operating in response to the fourth source line selection signal SSW2. The source line SL that the second and third memory blocks BLK21 and BLK31 share may be connected between the fifth and sixth switches 85 and 86.

The fourth selection circuit BS4 may be configured to selectively transmit the fourth voltage V4 or a voltage transmitted from the page buffer PB to the bit line BL that the third and fourth memory blocks BLK31 and BLK41 share. The fourth selection circuit BS4 may include seventh and eighth switches 87 and 88 connected in series between a terminal to which the fourth voltage V4 is applied and the page line PL. The seventh switch 87 may implemented as an NMOS transistor operating in response to a third bit line selection signal BSW3, and the eighth switch 88 may be implemented as an NMOS transistor operating in response to a fourth bit line selection signal BSW4. The bit line that the third and fourth memory blocks BLK31 and BLK41 share may be connected between the seventh and eighth switches 87 and 88.

The fifth selection circuit BS5 may be configured to selectively transmit a fifth voltage V5 or a voltage transmitted from the page buffer PB to the source line SL connected to the fourth memory block BLK41. The fifth selection circuit 6S5 may include ninth and tenth switches 89 and 90 connected in series between at terminal, to which the fifth voltage V5 is applied, and the page line PL. The ninth switch 89 may be implemented as an NMOS transistor operating in response to a fifth source line selection signal SSW5, and a tenth switch 90 may be configured as an NMOS transistor operating in response to a sixth source line selection signal SSW4. The source line SL connected to the fourth memory block BLK41 may be connected between the ninth and tenth switches 89 and 90.

The program operation of the selected memory block Sel. BLK will be described referring to Table 4 below.

TABLE 4

| | | 1 | ... | 16 | 17 | ... | 32 |
|---|---|---|---|---|---|---|---|
| BLK41 (Unsel. BLK) | SL | VCC | VCC | VCC | VCC | VCC | VCC |
| | SSL | Vssl | Vssl | Vssl | Vssl | Vssl | Vssl |
| | WL (first group) | Vpgm/ Vpass | Vpgm/ Vpass | Vpgm/ Vpass | Vpass | Vpass | Vpass |
| | WL (second group) | Vpass | Vpass | Vpass | Vpgm/ Vpass | Vpgm/ Vpass | Vpgm/ Vpass |
| | DSL | 0 V/−2 V | 0 V/−2 V | 0 V/−2 V | 0 V | 0 V | 0 V |
| | BL | VCC/0 V | VCC/0 V | VCC/0 V | VCC | VCC | VCC |
| BLK31 (Sel. | DSL | Vdsl | Vdsl | Vdsl | 0 V | 0 V | 0 V |
| | WL | Vpass | Vpass | Vpass | Vpgm/ | Vpgm/ | Vpgm/ |

TABLE 4-continued

|  |  | 1 | ... | 16 | 17 | ... | 32 |
|---|---|---|---|---|---|---|---|
| BLK) | (second group) |  |  |  | Vpass | Vpass | Vpass |
|  | WL (first group) | Vpgm/ Vpass | Vpgm/ Vpass | Vpgm/ Vpass | Vpass | Vpass | Vpass |
|  | SSL | 0 V | 0 V | 0 V | Vssl | Vssl | Vssl |
|  | SL | VCC | VCC | VCC | VCC/0 V | VCC/0 V | VCC/0 V |
| BLK21 (Unsel. BLK) | SSL | 0 V | 0 V | 0 V | 0 V/−2 V | 0 V/−2 V | 0 V/−2 V |
|  | WL (first group) | Vpgm/ Vpass | Vpgm/ Vpass | Vpgm/ Vpass | Vpass | Vpass | Vpass |
|  | WL (second group) | Vpass | Vpass | Vpass | Vpgm/ Vpass | Vpgm/ Vpass | Vpgm/ Vpass |
|  | DSL | Vdsl | Vdsl | Vdsl | Vdsl | Vdsl | Vdsl |
|  | BL | VCC | VCC | VCC | VCC | VCC | VCC |
| BLK11 (Unsel. BLK) | DSL | Vdsl | Vdsl | Vdsl | Vdsl | Vdsl | Vdsl |
|  | WL (second group) | Vpass | Vpass | Vpass | Vpgm/ Vpass | Vpgm/ Vpass | Vpgm/ Vpass |
|  | WL (first group) | Vpgm/ Vpass | Vpgm/ Vpass | Vpgm/ Vpass | Vpass | Vpass | Vpass |
|  | SSL | 0 V | 0 V | 0 V | 0 V | 0 V | 0 V |
|  | SL | VCC | VCC | VCC | VCC | VCC | VCC |

Referring to Table 4 above, the program operation of the selected memory block Sel. BLK may be performed by categorizing the memory cells into first and second groups as described above. For example, the memory cells of the first group may perform the program operation in a sequence from the memory cells adjacent to the source selection line SSL to the memory cell in the direction to the center. Accordingly, while the memory cells of the first group are programmed, the program voltage Vpgm or the pass voltage Vpass is applied to the word lines WL connected to the memory cells of the first group, and the pass voltage Vpass is applied to the word lines WL connected to the memory cells of the second group. While the memory cells of the second group are programmed, the program voltage Vpgm or the pass voltage Vpass is applied to the word lines WL connected to the memory cells of the second group, and the pass voltage Vpass is applied to the word lines WL connected to the memory cells of the first group.

The first to fourth memory blocks BLK11 to BLK41 may share the word lines. Therefore, if the program voltage Vpgm is applied to the selected word line of the selected memory block Sel. BLK, the program voltage Vpgm is applied to the corresponding word line of the unselected memory block. Accordingly, the voltage applied to the bit lines BL, the source lines SL, the drain selection lines DSL and the source selection lines SSL may be controlled such that the memory cells included in the unselected memory blocks Unsel. BLK are not programmed.

The program operation of the first and second groups will be described below.

Program Operation of the First Group.

While the program operation of the first group is performed at the third memory block BLK31, which is the selected memory block Sel. BLK, the power voltage Vcc is applied to the source lines SL connected to the third memory block BLK31, the turn off voltage (for example, 0V) is applied to the source selection lines SSL, the program voltage Vpgm or the pass voltage Vpass is applied to the word lines WL, the drain turn on voltage Vdsl (for example, 4V) is applied to the drain selection lines DSL, the program permission voltage (for example, 0V) or the program prohibition voltage (for example, Vcc) is applied to the bit lines BL.

In order to prevent the channel voltage of the fourth memory block BLK41 from being reduced by the program permission voltage (for example, 0V) among the voltages applied to the bit lines BL at the fourth memory block BLK41 which is the unselected memory block Unsel. BLK, the turn off voltage may be applied to the drain selection lines DSL. The turn off voltage may be the same as the program permission voltage, a voltage lower than the program permission voltage or a negative voltage. For example, the turn off voltage may be 0V or −2V. The voltage level may vary depending on the semiconductor device. The program prohibition voltage (for example, VCC) may be applied to the source lines SL connected to the fourth memory block BLK41, and the source turn on voltage Vssl may be applied to the source selection lines SSL. In order to sufficiently transmit the program prohibition voltage to the channel through the source lines SL, the source turn on voltage Vssl substantially maintains a high level at first, and thereafter, is substantially maintained higher than 0V but lower than the original high level. When the source turn on voltage Vssl is reduced, the channel boosting may occur as the source selection transistors SST are turned off. As a result, the memory cells of the first group included in the unselected fourth memory block BLK41 may not be programmed.

The turn off voltage may be applied to the source selection lines SSL at the second memory block BLK21, which is the unselected memory block Unsel. BLK, and the source selection transistors SST may be turned off. For example, the turn off voltage may be 0V. The program prohibition voltage (For example, Vcc) may be applied to the bit line BL connected to the second memory block BLK21, and the drain turn on voltage Vdsl may be applied to the drain selection lines DSL, thereby increasing the channel voltage of the second memory block BLK21. In order to sufficiently transmit the program prohibition voltage to the channel through the bit lines BL, the drain turn on voltage Vdsl substantially maintain a high level at first, and thereafter, is substantially maintained higher than 0V but lower than the original high level. When the drain turn on voltage Vdsl is reduced, the channel boosting may occur as the drain selection transistors DST are turned off. As a result, the memory cells of the first group included in the unselected second memory block BLK21 may not be programmed.

In order to prevent the channel voltage from being reduced at the first memory block BLK11, which is the unselected memory block Unsel. BLK, the power voltage Vcc is applied to the source lines SL and the turn off voltage (for example, 0V) is applied to the source selection lines SSL, thereby turning off the source selection transistors SST. Since the program prohibition voltage (for example, Vcc) is applied to the bit lines BL, the drain selection transistors DST may be turned on by applying the drain turn on voltage Vdsl to the drain selection lines DSL. In order to sufficiently transmit the program prohibition voltage to the channel through the bit lines BL, the drain turn on voltage Vdsl substantially maintains a high level at first, and thereafter, is substantially maintained higher than 0V but lower than the original high level. When the drain turn on voltage Vdsl is reduced, the channel boosting may occur as the drain selection transistors DST are turned off. As a result, the memory cells of the first group included in the unselected first memory block BLK11 may not be programmed.

Program Operation of the Second Group.

When the program operation of the first group is completed at the third memory block BLK31 which is the selected memory block Sel. BLK, the program operation of the second group may be performed.

While the program operation of the second group is performed, the power voltage Vcc is applied to the bit lines BL connected to the third memory block BLK31, the turn off voltage (for example, 0V) is applied to the drain selection lines DSL, the program voltage Vpgm or the pass voltage Vpass is applied to the word lines WL, the source turn on voltage Vssl (for example, 4V) is applied to the source selection lines SSL, the program permission voltage (for example, 0V) or the program prohibition voltage (for example, Vcc) is applied to the source lines SL.

The program prohibition voltage (for example, Vcc) is applied to the source lines SL at the fourth memory block BLK41, which is the unselected memory block Unsel. BLK, and the source turn on voltage Vssl may be applied to the source selection lines SSL. Since the power voltage Vcc is applied to the bit lines BL, the turn off voltage (for example, 0V) may be applied to the drain selection lines DSL. In order to sufficiently transmit the program prohibition voltage to the channel through the bit lines BL, the drain turn on voltage Vdsl substantially maintains a high level at first, and thereafter, is substantially maintained higher than 0V but lower than the original high level. When the drain turn on voltage Vdsl is reduced, the channel boosting may occur as the drain selection transistors DST are turned off. As a result, the memory cells of the second group included in the unselected fourth memory block BLK41 may not be programmed.

Since the program prohibition voltage (for example, Vcc) or the program permission voltage (for example, 0V) is applied to the source lines SL at the second memory block BLK21, which is the unselected memory block Unsel. BLK, the turn off voltage (for example, 0V) may be applied to the source selection lines SSL. The turn off voltage may be the same as the program permission voltage, a voltage lower than the program permission voltage or a negative voltage. For example, the turn off voltage may be 0V or −2V; the voltage level may vary depending on the semiconductor device. The program prohibition voltage (for example, Vcc) is applied to the bit lines BL connected to the second memory block BLK21, and the drain turn on voltage Vdsl is applied to the drain selection lines DSL. In order to sufficiently transmit the program prohibition voltage to the channel through the bit lines BL, the drain turn on voltage Vdsl substantially maintains a high level at first, and thereafter, is substantially maintained higher than 0V but lower than the original high level. When the drain turn on voltage Vdsl is reduced, the channel boosting may occur as the drain selection transistors DST are turned off. As a result, the memory cells of the second group included in the unselected second memory block BLK21 may not be programmed.

In order to prevent the channel voltage from being reduced at the first memory block BLK11, which is the unselected memory block Unsel. BLK, the power voltage Vcc is applied to the source lines SL, and the turn off voltage (for example, 0V) is applied to the source selection lines SSL, thereby turning off the source selection transistors SST. Since the program prohibition voltage (for example, Vcc) is applied to the bit lines BL, the drain selection transistors DST are turned on by applying the drain turn on voltage Vdsl to the drain selection lines DSL. In order to sufficiently transmit the program prohibition voltage to the channel through the bit lines BL, the drain turn on voltage Vdsl substantially maintains a high level at first, and thereafter, is substantially maintained higher than 0V but lower than the original high level. When the drain turn on voltage Vdsl is reduced, the channel boosting may occur as the drain selection transistors DST are turned off. As a result, the memory cells of the second group included in the unselected first memory block BLK11 may not be programmed.

The read operation of the semiconductor device will be described referring to Table 5 below.

TABLE 5

| | | 1 | ... | 16 | 17 | ... | 32 |
|---|---|---|---|---|---|---|---|
| BLK41 (Unsel. BLK) | SL | VCC | VCC | VCC | VCC | VCC | VCC |
| | SSL | Vssl | Vssl | Vssl | Vssl | Vssl | Vssl |
| | WL (first group) | Vread/Vpass | Vread/Vpass | Vread/Vpass | Vpass | Vpass | Vpass |
| | WL (second group) | Vpass | Vpass | Vpass | Vread/Vpass | Vread/Vpass | Vread/Vpass |
| | DSL | 0 V | 0 V | 0 V | 0 V | 0 V | 0 V |
| | BL | VCC | VCC | VCC | 0 V | 0 V | 0 V |
| BLK31 (Sel. BLK) | DSL | Vdsl | Vdsl | Vdsl | Vdsl | Vdsl | Vdsl |
| | WL (second group) | Vpass | Vpass | Vpass | Vread/Vpass | Vread/Vpass | Vread/Vpass |
| | WL (first group) | Vread/Vpass | Vread/Vpass | Vread/Vpass | Vpass | Vpass | Vpass |
| | SSL | Vssl | Vssl | Vssl | Vssl | Vssl | Vssl |
| | SL | 0 V | 0 V | 0 V | VCC | VCC | VCC |
| BLK21 (Unsel. BLK) | SSL | 0 V | 0 V | 0 V | 0 V | 0 V | 0 V |
| | WL (first group) | Vread/Vpass | Vread/Vpass | Vread/Vpass | Vpass | Vpass | Vpass |
| | WL (second group) | Vpass | Vpass | Vpass | Vread/Vpass | Vread/Vpass | Vread/Vpass |
| | DSL | Vdsl | Vdsl | Vdsl | Vdsl | Vdsl | Vdsl |
| | BL | VCC | VCC | VCC | VCC | VCC | VCC |

TABLE 5-continued

|  |  | 1 | ... | 16 | 17 | ... | 32 |
|---|---|---|---|---|---|---|---|
| BLK11 (Unsel. BLK) | DSL | Vdsl | Vdsl | Vdsl | Vdsl | Vdsl | Vdsl |
| | WL (second group) | Vpass | Vpass | Vpass | Vread/Vpass | Vread/Vpass | Vread/Vpass |
| | WL (first group) | Vread/Vpass | Vread/Vpass | Vread/Vpass | Vpass | Vpass | Vpass |
| | SSL | 0 V | 0 V | 0 V | 0 V | 0 V | 0 V |
| | SL | 0 V | 0 V | 0 V | 0 V | 0 V | 0 V |

Referring to Table 5, the read operation of the selected memory block Sel. BLK may be performed by categorizing the memory cells into first and second groups as described above in Table 2. For example, the memory cells included in the first group may be read in the order arranged from the source line SL towards the center, and the memory cells included in the second group may be read in the order arranged from the bit line BL towards the center. While the memory cells of the first group are read, the read voltage Vread or the pass voltage Vpass is applied to the word lines WL connected to the memory cells of the first group, and the pass voltage Vpass is applied to the word lines WL connected to the memory cells of the second group. While the memory cells of the second group are read, the read voltage Vread or the pass voltage Vpass is applied to the word lines WL connected to the memory cells of the second group, and the pass voltage Vpass is applied to the word lines WL connected to the memory cells of the first group. Also, while the read operation of the selected memory block Sel. BLK is performed, the read disturbance of the selected memory block Sel. BLK is inhibited by applying the precharge voltage to the channel of the unselected memory blocks Unsel. BLK.

The voltage that is applied to the drain selection lines DSL, the source selection lines SSL, the bit lines BL and the source lines SL connected to the unselected memory blocks Unsel. BLK at the time of the read operation of the first group may be applied substantially in the same manner as in the read operation of the second group.

While the read operation of the first group is performed at the third memory block BLK31, which is the selected memory block Sel. BLK, 0V may be applied to the source lines SL connected to the third memory block BLK31, the source turn on voltage may be applied to the source selection lines SSL, the read voltage Vread or the pass voltage Vpass may be applied to the word lines WL, the drain turn on voltage Vdsl may be applied to the drain selection lines DSL, and the precharge voltage may be applied to the bit lines BL. That 0V is applied to the source lines SL means that the source lines SL are connected to the ground terminal. The source turn on voltage Vssl and the drain turn on voltage Vdsl for example may be set to 4V. The precharge voltage may be set to a positive voltage, for example the power voltage Vcc or 1V. After the read operation of the first group is complete, the read operation of the second group is carried out. The read operation of the second group may apply the precharge voltage to the source lines SL connected to the third memory block BLK31, the source turn on voltage to the source selection lines SSL, the read voltage Vread or the pass voltage Vpass to the word lines WL, the drain turn on voltage Vdsl to the drain selection lines DSL, and 0V to the bit lines BL. That 0V is applied to the bit lines BL means that the bit lines BL are connected to the ground terminal. The source turn on voltage Vssl and the drain turn on voltage Vdsl for example may be set to 4V. The precharge voltage may be set to a positive voltage, for example the power voltage Vcc or 1V.

At the time of the read operation of the first and second groups of the selected memory block Sel. BLK, the turn off voltage is applied to the drain selection lines DSL at the fourth memory block BLK41, which is the unselected memory block Unsel. BLK, the precharge voltage Vcc is applied to the source lines SL, and the source turn on voltage Vssl is applied to the source selection lines SSL. For example, the turn off voltage may be set to 0V, the precharge voltage may be set to the power voltage Vcc, and the source turn on voltage Vssl may be set to 4V.

The turn off voltage is applied to the source selection lines SSL at the second memory block BLK21, which is the unselected memory block Unsel. BLK, the drain turn on voltage Vdsl is applied to the drain selection lines DSL, and the precharge voltage is applied to the bit lines BL. For example, the turn off voltage may be set to 0V, the drain turn on voltage Vdsl may be set to 4V, and the precharge voltage may be set to the power voltage Vcc.

The drain turn on voltage Vdsl may be applied to the drain selection lines DSL at the first memory block BLK11, which is the unselected memory block Unsel. BLK, 0V may be applied to the source lines SL, and the turn off voltage may be applied to the source selection lines SSL. For example, the drain turn on voltage Vdsl may be set to 4V, and the turn off voltage may be set to 0V. The voltages described above discuss voltage levels to facilitate understanding of the disclosures made herein, and various voltage levels may be implemented depending on the semiconductor device.

The erase operation of the semiconductor device will be described referring to Table 6 below.

TABLE 6

|  |  | Sel. ST | In. ST | Unsel. BLK |
|---|---|---|---|---|
| BLK41 (Unsel. BLK) | SL | FT | FT | Verase |
| | SSL | FT | FT | Vssl |
| | WL | 0 V | 0 V | Vwl |
| | DSL | 0 V | 0 V | Vdsl |
| | BL | Verase | Vinh | Verase/Vinh |
| BLK31 (Sel. BLK) | DSL | Vdsl | Vdsl | Vdsl |
| | WL | 0 V | 0 V | Vwl |
| | SSL | Vssl | Vssl | Vssl |
| | SL | Verase | Vinh | Verase/Vinh |
| BLK21 (Unsel. BLK) | SSL | 0 V | 0 V | Vssl |
| | WL | 0 V | 0 V | Vwl |
| | DSL | 0 V | 0 V | Vdsl |
| | BL | Verase | Verase | Verase |
| BLK11 (Unsel. BLK) | DSL | 0 V | 0 V | Vdsl |
| | WL | 0 V | 0 V | Vwl |
| | SSL | 0 V | 0 V | Vssl |
| | SL | Verase | Verase | Verase |

Referring to Table 6, the erase voltage Verase may be applied to all of the bit lines BL and the source lines SL when the erase operation commences, and the erase permission voltage may be applied to the word lines WL connected to the selected memory block Sel. BLK. For example, the erase voltage Verase may use 18V, and the erase permission voltage may use 0V. That 0V is applied to the word lines WL means that the ground terminal is connected to the word lines WL. As described in FIG. 7, since the memory blocks BLK11, BLK21, BLK31 and BLK41 that are vertically stacked share the word lines WL, the erase permission voltage may be applied to the word lines WL even at the unselected memory blocks BLK11, BLK21 and BLK41 that share the word lines WL with the selected memory block Sel. BLK. Accordingly, it is important to control the voltages being applied to the bit lines BL, the source lines SL, the drain selection lines DSL and the source selection lines SSL in such unselected memory blocks BLK11, BLK21 and BLK41.

The erase operation may be performed using the ISPE method. When the erase operation commences, all of the cell strings included in the selected memory block Sel. BLK may be the selected cell strings Sel. ST, targets to be erased. When the erase operation commences, the erase voltage Verase may be applied to all of the bit lines BL and the source lines SL connected to the selected memory block Sel. BLK, the drain turn on voltage Vdsl may be applied to the drain selection lines DSL, and the source turn on voltage Vssl may be applied to the source selection lines SSL. Zero V (0V), which may be the erase permission voltage, may be applied to the word lines WL connected to the selected memory block Sel. BLK. When a cell string group is generated consisting only of the cell strings where the erasure is completed among the cell strings of the selected memory block Sel. BLK upon performing the erase verification operation, the cell strings included in the corresponding cell string group may be the erase inhibition cell strings In. ST. In order to prevent the threshold voltage of the memory cells to be excessively reduced while the erase operation is carried out on the selected cell strings Sel. ST, for which the erasure is not completed in the erase inhibition cell strings In. ST, the erase inhibition voltage Vinh may be applied to the bit lines BL and the source lines SL. The erase inhibition voltage Vinh may be a voltage that is lower than the erase voltage Verase and higher than 0V. The erase inhibition voltage Vinh may be set to a voltage corresponding to ½ of the erase voltage Verase. Assuming that the erase voltage Verase is 18V, the erase inhibition voltage Vinh may be set to 9V. When the erase inhibition voltage Vinh is applied to the bit lines BL and the source lines SL of the erase inhibition cell strings In. ST, even though 0V, which is the erase permission voltage, may be applied to the word lines WL, there may be a low voltage difference of 9V between the word lines WL and the channel, thereby inhibiting the threshold voltage of the memory cells from being excessively reduced.

While the erase operation of the selected memory block Sel. BLK is carried out, the operation of the first memory block BLK11, the second memory block BLK21 and the fourth memory block BLK41, which share the word lines WL connected to the selected memory block Sel. BLK, will be described below.

Regardless of the voltage being applied to the bit lines BL at the fourth memory block BLK41, the turn off voltage may be applied to the drain selection lines DSL. The turn off voltage may be 0V or a negative voltage. When the turn off voltage is a negative voltage, about −2V may be used. Since the source lines SL of the fourth memory block BLK41 may not be shared with other memory blocks, the source lines SL and the source selection lines SSL may all be floated.

Regardless of the voltage being applied to the source lines SL at the second memory block BLK21, the turn off voltage may be applied to the source selection lines SSL. The turn off voltage may be 0V or a negative voltage. When the turn off voltage is a negative voltage, about −2V may be used, and the leakage at the source selection transistors SST may be prevented. The erase voltage Verase may be applied to the bit lines BL of the second memory block BLK21.

The turn off voltage may be applied to the drain and the source selection lines DSL and SSL at the first memory block BLK11, and the erase voltage Verase may be applied to the source lines SL.

While the erase operation of the selected memory lock Sel. BLK is carried out, the operation of the unselected memory blocks Unsel. BLK that do not share the word lines WL connected to the selected memory block Sel. BLK will be described below.

The drain turn on voltage Vdsl may be applied to the drain selection lines DSL at the memory block that shares the bit lines BL and the source lines SL of the selected memory block Sel. BLK among the unselected memory blocks Unsel. BLK, and the source turn on voltage Vssl may be applied to the source selection lines SSL, thereby turning on the drain and source selection transistors DST and SST. Accordingly, since the erase voltage Verase may be applied to the channel of the cell strings, the erase prohibition voltage Vwl may be applied to the word lines WL connected to the unselected memory blocks Unsel. BLK, thereby preventing the memory cells from being erased. The erase voltage Verase may be applied to the bit lines BL and the source lines SL connected to the unselected memory blocks Unsel. BLK, the drain turn on voltage Vdsl may be applied to the drain selection lines DSL, the source turn on voltage Vssl may be applied to the source selection lines SSL, and the erase prohibition voltage Vwl may be applied to the word lines. Accordingly, the memory cells included in the unselected memory blocks Unsel. BLK may be prevented from being erased, and stress due to the erase voltage Verase may be prevented from being reduced.

In addition to the erase operation described above in Table 6, the erase operation according to an exemplary implementation will be described referring to Table 7.

TABLE 7

|  |  | Sel. ST | In. ST | Unsel. BLK |
| --- | --- | --- | --- | --- |
| BLK41 (Unsel. BLK) | SL | FT | FT | FT |
|  | SSL | 0 V | 0 V | 0 V |
|  | WL | 0 V | 0 V | 0 V |
|  | DSL | 0 V | 0 V | 0 V |
| BLK31 (Sel. BLK) | BL | Verase | Vinh | Verase/Vinh |
|  | DSL | Vdsl | Vdsl | 0 V |
|  | WL | 0 V | 0 V | 0 V |
|  | SSL | Vssl | Vssl | 0 V |
| BLK21 (Unsel. BLK) | SL | Verase | Vinh | Verase/Vinh |
|  | SSL | 0 V | 0 V | 0 V |
|  | WL | 0 V | 0 V | 0 V |
|  | DSL | 0 V | 0 V | 0 V |
| BLR11 (Unsel. BLK) | BL | FT | FT | FT |
|  | DSL | 0 V | 0 V | 0 V |
|  | WL | 0 V | 0 V | 0 V |
|  | SSL | 0 V | 0 V | 0 V |
|  | SL | FT | FT | FT |

Referring to Table 7, the eraser voltage Verase may not be applied to the channels of the cell strings of the memory blocks Unsel. BLK that have not bee selected. The bit lines BL and the source lines SL may be floated connected to unselected memory blocks Unsel. BLK except for the bit lines BL and the source lines SL of the selected memory blocks Sel. BLK, and the turn off voltage may be applied to the drain selection lines DSL and the source selection lines SSL. Accordingly, the memory cells included in the unselected memory blocks Unsel. BLK are not affected by the erase voltage Verase, there is no stress due to the erase voltage Verase either.

By way of summation and review, in various exemplary implementations, there is provided a semiconductor device and a method of operating the same capable of improving a program operation, a read operation and an erase operation.

By reducing, at the time of operating a 3-dimensional semiconductor device, resistance of cell strings, disturbance may be inhibited, retention characteristics may be improved, the reliability of the read operation can be enhanced, increase in width of threshold voltage distribution of memory cells may be inhibited at the time of performing the erase operation, and stress may be reduced.

Various exemplary implementations described above are not limited to an apparatus and a method but may be implemented through a program implementing functions corresponding to the features of exemplary implementations or a recording medium where the program is recorded. Such implementation may be easily done by a person of ordinary skill in the art based on the description of the exemplary implementations.

Example exemplary implementations have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular exemplary implementation may be used singly or in combination with features, characteristics, and/or elements described in connection with other exemplary implementations unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
 a plurality of memory blocks including a plurality of cell strings extending substantially perpendicular to a semiconductor substrate, the plurality of cell strings sharing a plurality of bit lines, and a plurality of source lines respectively connected to the cell strings and word lines;
 page buffers, connected to the bit lines, suitable for storing data;
 a selection switch portion configured to selectively transmit a voltage to the bit lines or the source lines during the program operation, the read operation and the erase operation, wherein the voltage is supplied from the page buffers or an external source; and
 a control circuit configured to control the page buffers and the selection switch portion.

2. The semiconductor device of claim 1, wherein the selection switch portion comprises:
 a first selection circuit configured to:
 selectively transmit a first voltage, of the voltages, to the source lines, or
 selectively transmit a voltage output from the page buffers to the source lines; and
 a second selection circuit configured to:
 selectively transmit a second voltage, of the voltages to the bit lines, or
 selectively transmit the voltage output from the page buffers to the bit lines.

3. The semiconductor device of claim 2, wherein the first selection circuit comprises:
 a first switch connected between a terminal, to which the first voltage is applied, and a first node, the first switch operating in response to a first source line selection signal; and
 a second switch connected between the first node and the page buffers, the second switch operating in response to a second source line selection signal.

4. The semiconductor device of claim 2, wherein the second selection circuit comprises:
 a third switch connected between a terminal, to which the second voltage is applied, and a second node, the third switch operating in response to a first bit line selection signal; and
 a fourth switch connected between the second node and the page buffer, the fourth switch operating in response to a second bit line selection signal.

5. The semiconductor device of claim 1, wherein the plurality of cell strings comprise a plurality of source selection transistors, memory cells and a plurality of drain selection transistors sequentially arranged over a semiconductor.

6. The semiconductor device of claim 5, wherein gates of the source selection transistors, of the plurality of source selection transistors, which are connected to a same source line are connected to different source selection lines, and
 wherein gates of the source selection transistors, of the plurality of source selection transistors, which are connected to different source lines are connected to a source selection line.

7. The semiconductor device of claim 5, wherein gates of the memory cells are arranged in a same layer of the memory cells, and wherein the gates of the memory cells are connected to a same word line.

8. The semiconductor device of claim 5, wherein gates of the drain selection transistors are connected to a same bit line among the drain selection transistors are connected to different drain selection lines,
 wherein gates of the plurality of drain selection transistors are connected to different bit lines, and wherein the gates of the plurality of drain selection transistors are connected to different drain selection lines.

9. The semiconductor device of claim 1, wherein the memory blocks are arranged longitudinally and in a direction substantially perpendicular to a semiconductor substrate.

10. The semiconductor device of claim 9, wherein memory blocks adjacent to the memory blocks are configured to share the bit lines or the source lines.

11. A method of operating a semiconductor device including a cell string, including $1^{st}$ to $K^{th}$ memory cells, connected between a source line and a bit line and extending substantially perpendicular to a semiconductor substrate, wherein the $1^{st}$ memory cell is adjacent to the source line and the $K^{th}$ memory cell is adjacent to the bit line, the method comprising:
 performing a first program operation sequentially from the $1^{st}$ memory cell to I-$1^{th}$ memory cell, where I is smaller than K; and
 performing a second program operation sequentially from the $K^{th}$ memory cell to $I^{th}$ memory cell.

12. The method of claim 11, wherein the I-$1^{th}$ memory cell is adjacent to the $I^{th}$ memory cell in a direction to the source line.

13. The method of claim 11, wherein, during the first program operation, a program permission voltage or a program prohibition voltage is applied to the cell string through the bit line, and wherein, during the second program operation, the program permission voltage or the program prohibition voltage is applied to the cell string through the source line.

14. A method of operating a semiconductor device including cell string, including $1^{st}$ to $K^{th}$ memory cells, connected between a source line and a bit line and extending substantially perpendicular to a semiconductor substrate, wherein the $1^{st}$ memory cell is adjacent to the source line and the $K^{th}$ memory cell is adjacent to the bit line, the method comprising:

performing a first read operation sequentially from the $1^{st}$ memory cell to I-$1^{th}$ memory cell, where I is smaller than K; and performing a second read operation sequentially from the $K^{th}$ memory cell to $I^{th}$ memory cell.

15. The method of claim 14, wherein the I-$1^{th}$ memory cell is adjacent to the $I^{th}$ memory cell in a direction to the source line.

16. The method of claim 14, wherein, during the first read operation, a precharge voltage is applied to the cell string through the bit line and the source line are connected to a ground terminal, and wherein, during the second read operation, the precharge voltage is applied to the cell string through the source line and the bit line are connected to the ground terminal.

17. A method of operating a semiconductor device including a plurality of cell strings connected to a plurality of source lines and a plurality of bit lines and extending substantially perpendicular to a semiconductor substrate, the method comprising:

erasing memory cells included in a selected memory block, connected to the plurality of source lines and the plurality of bit lines, by applying an erase voltage, generated from a selection switch portion, to the plurality of bit lines and the plurality of source lines connected to the selected memory block, and by applying an erase permission voltage to word lines connected to the selected memory block;

verifying that the memory cells are erased; and applying an erase inhibition voltage to bit lines, of the plurality of bit lines, connected to the cell strings that have been erased, and to source lines, of the plurality of source lines, connected to the cell strings that have been erased while erasing the memory cells in the cell strings that have not been erased.

18. The method of claim 17, further comprising:

applying an erase prohibition voltage to the word lines connected to unselected memory blocks.

19. The method of claim 18, wherein a value of the erase prohibition voltage is less than or equal to a value of the erase voltage and greater than 0V.

20. The method of claim 17, wherein a value of the erase inhibition voltage is set to ½ of a value of the erase voltage.

* * * * *